(12) United States Patent
You et al.

(10) Patent No.: US 10,964,852 B2
(45) Date of Patent: Mar. 30, 2021

(54) LED MODULE AND LED LAMP INCLUDING THE SAME

(71) Applicant: Samsung Electronics Co., Ltd., Suwon-si (KR)

(72) Inventors: Jae Sung You, Osan-si (KR); Ho Sun Paek, Suwon-si (KR); Ho Young Song, Suwon-si (KR); Jun Bum Lee, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/223,990

(22) Filed: Dec. 18, 2018

(65) Prior Publication Data
US 2019/0326480 A1  Oct. 24, 2019

(30) Foreign Application Priority Data

Apr. 24, 2018 (KR) .................. 10-2018-0047560
Aug. 8, 2018 (KR) .................. 10-2018-0092318

(51) Int. Cl.
*H01L 33/00* (2010.01)
*H01L 33/50* (2010.01)
*H01L 33/40* (2010.01)
*H01L 33/26* (2010.01)
*H01L 33/10* (2010.01)
*H05B 45/00* (2020.01)

(52) U.S. Cl.
CPC ............. *H01L 33/50* (2013.01); *H01L 33/10* (2013.01); *H01L 33/26* (2013.01); *H01L 33/40* (2013.01); *H05B 45/00* (2020.01)

(58) Field of Classification Search
CPC .......... H01L 33/10; H01L 33/50; H05B 45/00
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| JP | 2017-174806 A | 9/2017 |
| KR | 10-2017-0022293 A | 3/2017 |
| KR | 10-1824557 B1 | 3/2018 |

*Primary Examiner* — Samuel A Gebremariam
(74) *Attorney, Agent, or Firm* — Muir Patent Law, PLLC

(57) ABSTRACT

A light emitting diode (LED) module includes: a flexible substrate having a first surface on which a circuit pattern is disposed, and a second surface opposite the first surface; a plurality of light emitting diode (LED) chips mounted on the first surface of the flexible substrate, and electrically connected to the circuit pattern; an insulating reflective layer disposed on the first surface of the flexible substrate, and covering a portion of the circuit pattern; first and second connection terminals disposed at both ends of the flexible substrate, and connected to the circuit pattern; and a wavelength conversion layer covering the plurality of LED chips and surrounding the flexible substrate in a cross-sectional view.

19 Claims, 14 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 6/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,791,477 B2 | 7/2014 | Lee et al. |
| 9,587,811 B2 | 3/2017 | Kamada |
| 9,799,807 B2 | 10/2017 | Yamada et al. |
| 2015/0014732 A1 | 1/2015 | DeMille et al. |
| 2016/0279437 A1 | 9/2016 | Park |
| 2017/0084809 A1 | 3/2017 | Jiang et al. |
| 2019/0257499 A1* | 8/2019 | Fujikawa ............... F21V 19/005 |

* cited by examiner

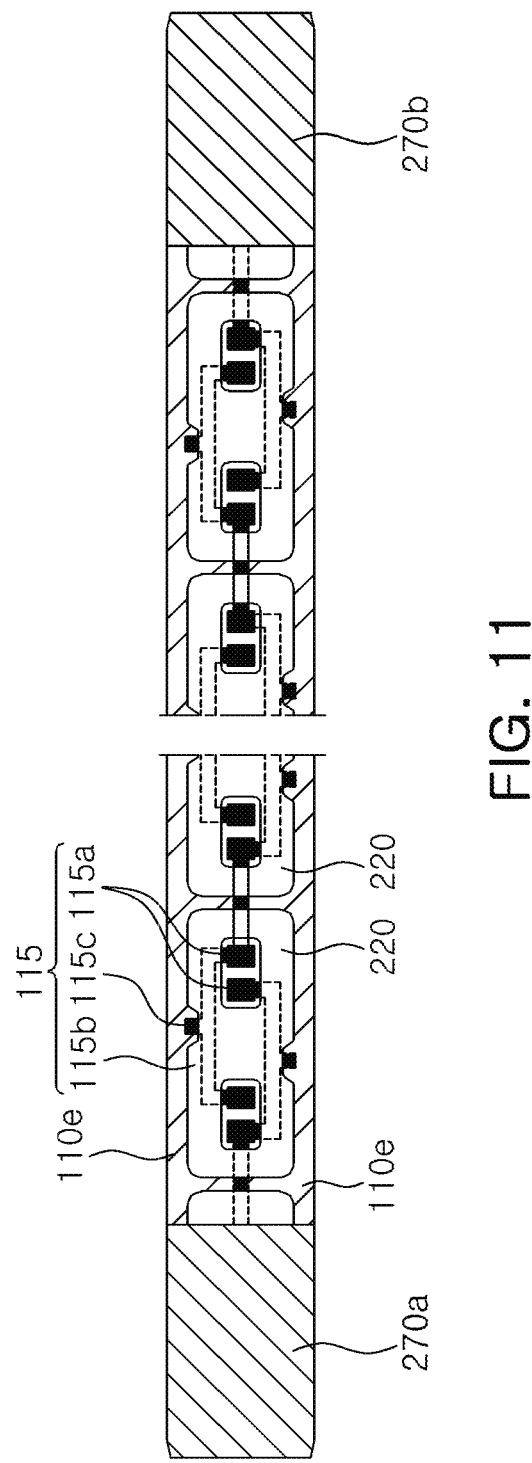

LED MODULE AND LED LAMP INCLUDING THE SAME

CROSS-REFERENCE TO RELATED APPLICATIONS

This application claims benefit of priority to Korean Patent Application No. 10-2018-0047560 filed on Apr. 24, 2018, and Korean Patent Application No. 10-2018-0092318 filed on Aug. 8, 2018 in the Korean Intellectual Property Office, the disclosures of which are incorporated herein by reference in their entirety.

BACKGROUND

1. Field

The present disclosure relates to a light emitting diode (LED) module, and an LED lamp comprising the LED module.

2. Description of Related Art

In general, incandescent bulb lamps or fluorescent lamps are often used as indoor or outdoor lighting lamps. Such incandescent bulb lamps or fluorescent lamps have a relatively short lifespan, and, therefore, may need to be frequently replaced.

In order to solve such a problem, a lighting device using a light emitting diode (LED) having high photoelectric conversion efficiency and an excellent lifespan has been prominent. In addition, LEDs offer various advantages, such as greater resistance to impacts than conventional bulb lamps or fluorescent lamps, relatively low power consumption, a semi-permanent lifespan, and versatile lighting effects with various colors.

As demand for the adoption of LEDs in a lighting field has increased, various demands such as for processability and light distribution characteristics, are also increasing.

SUMMARY

An aspect of the present inventive concept is to provide a filament-type LED module having excellent processability, in which light distribution characteristics are adjusted and luminous flux is improved.

An aspect of the present inventive concept is to provide an LED lamp including a filament-type LED module having excellent processability in which light distribution characteristics are adjusted and luminous flux is improved.

According to an aspect of the present inventive concept, an light emitting diode (LED) module includes a flexible substrate having a first surface on which a circuit pattern is disposed, and a second surface opposite to the first surface; a plurality of light emitting diode (LED) chips mounted on the first surface of the flexible substrate, and electrically connected to the circuit pattern; an insulating reflective layer disposed on the first surface of the flexible substrate, and covering a portion of the circuit pattern; first and second connection terminals disposed at both ends of the flexible substrate, and connected to the circuit pattern; and a wavelength conversion layer covering the plurality of LED chips and surrounding the flexible substrate in a cross-sectional view.

According to an aspect of the present inventive concept, an light emitting diode (LED) module includes a flexible substrate having first and second surfaces opposite to each other, the flexible substrate having an elongated shape; a circuit pattern disposed on the first surface of the flexible substrate, and having a pad region, a connection pattern connected to the pad region, and a dummy pattern protruding from the connection pattern; a plurality of LED chips disposed on the first surface of the flexible substrate, each of the plurality of LED chips electrically connected to the pad region of the circuit pattern; an insulating reflective layer mounted on the first surface of the flexible substrate, and covering a portion of the circuit pattern; first and second connection terminals disposed at both ends of the flexible substrate, and connected to the circuit pattern; and a wavelength conversion layer covering the plurality of LED chips and surrounding the flexible substrate in a cross-sectional view.

According to an aspect of the present inventive concept, an light emitting diode (LED) module includes a flexible substrate having first and second surfaces opposite to each other, the flexible substrate having an elongated shape; a circuit pattern disposed on the first surface of the flexible substrate; a plurality of LED chips disposed on the first surface of the flexible substrate, and the plurality of LED chips electrically connected to the circuit pattern; an insulating reflective layer mounted on the first surface of the flexible substrate, the insulating reflective layer covering a portion of the circuit pattern, and the insulating reflective layer comprising a plurality of discrete patterns spaced apart from each other in the longitudinal direction; first and second connection terminals respectively disposed at both ends of the flexible substrate, and the first and second connection terminals electrically connected to the circuit pattern; and a wavelength conversion layer covering the plurality of LED chips and surrounding the flexible substrate in a cross-sectional view.

According to an aspect of the present inventive concept, an light emitting diode (LED) device includes a base; a lamp cover mounted on the base, and having an internal space; and at least one LED module disposed in an internal space of the lamp cover, wherein the at least one LED module comprises: a flexible substrate having first and second surfaces opposite to each other, and having a bar shape; a circuit pattern disposed on the first surface of the flexible substrate; a plurality of LED chips arranged on the first surface of the flexible substrate in a longitudinal direction of the flexible substrate, and electrically connected to the circuit pattern; an insulating reflective layer mounted on the first surface of the flexible substrate, and covering a portion of the circuit pattern to surround the plurality of LED chips, respectively; first and second connection terminals disposed at both ends of the flexible substrate, and connected to the circuit pattern; and a wavelength conversion layer covering the plurality of LED chips and surrounding the flexible substrate in a cross-sectional view.

BRIEF DESCRIPTION OF DRAWINGS

The above and other aspects, features, and advantages of the present disclosure will be more clearly understood from the following detailed description, taken in conjunction with the accompanying drawings, in which:

FIG. 11 is a plan view of a substrate employed in an LED module according to an embodiment of the present inventive concept;

DETAILED DESCRIPTION

Hereinafter, example embodiments of the present inventive concept will be described with reference to the accompanying drawings.

Figure 1:
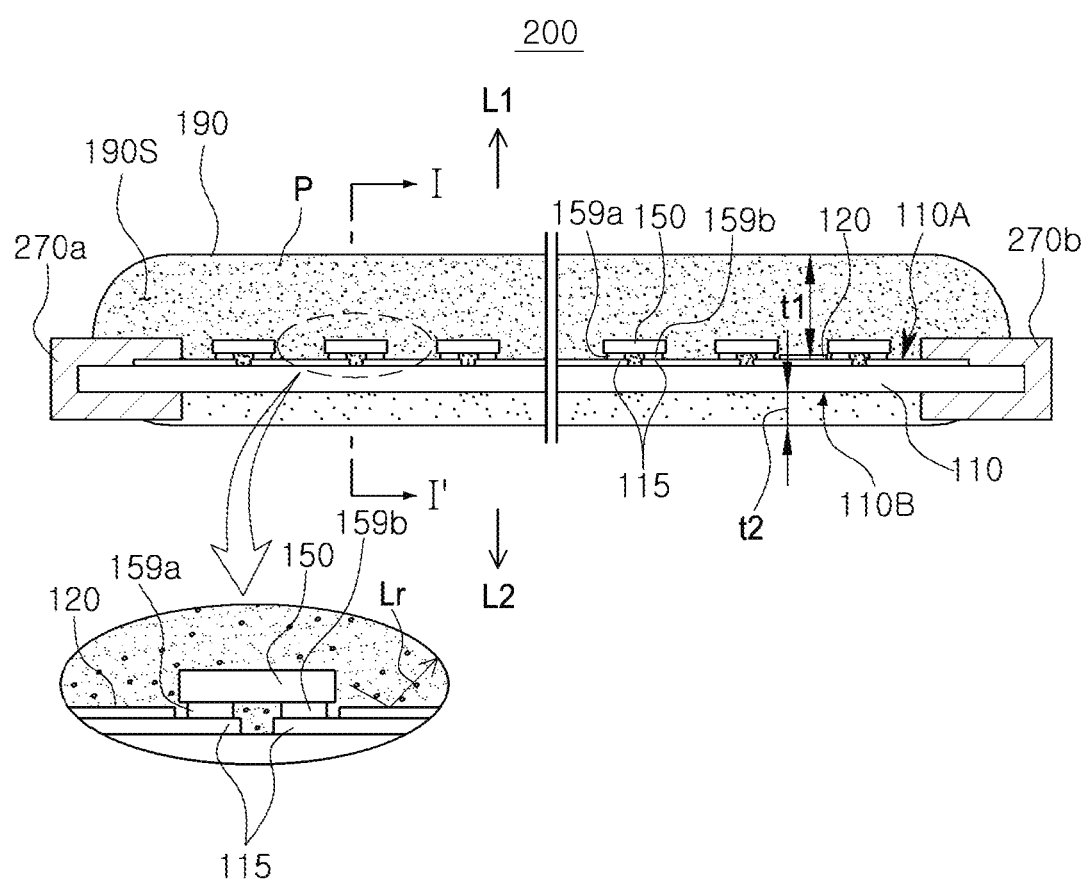
FIG. 1 is a cross-sectional view illustrating a light emitting diode (LED) module according to an embodiment of the present inventive concept.
Figure 2:
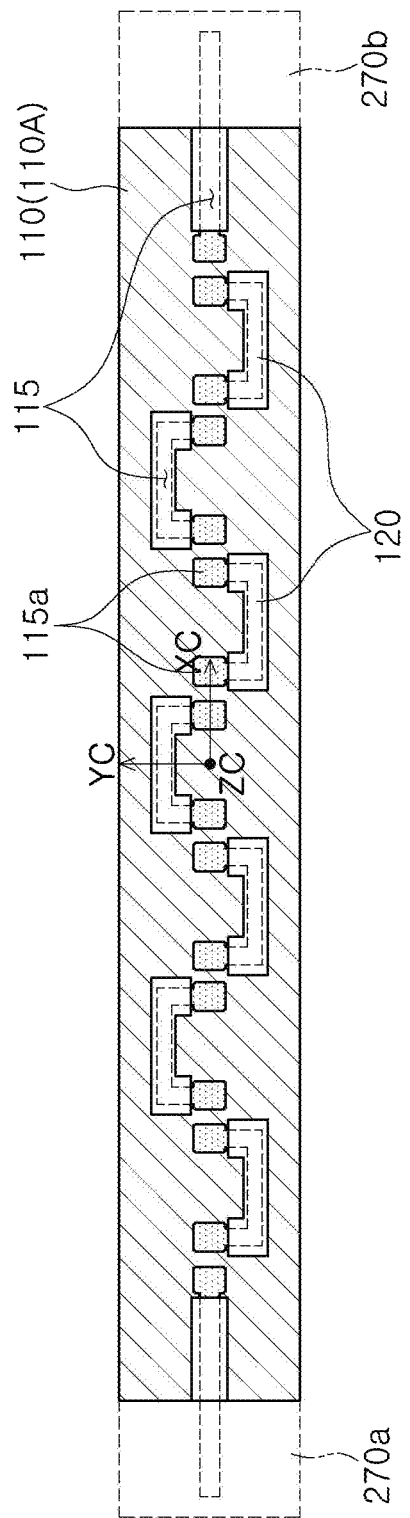
FIG. 2 is a plan view of a substrate employed in the LED module illustrated in FIG. 1.

FIG. 1 is a cross-sectional view illustrating a light emitting diode (LED) module according to an embodiment of the present inventive concept, and FIG. 2 is a plan view illustrating a substrate employed in the LED module illustrated in FIG. 1.

Referring to FIGS. 1 and 2, an LED module 200 according to this embodiment may include a flexible substrate 110 having a first surface 110A and a second surface 110B positioned opposite to each other, a plurality of light emitting diode (LED) chips 150 mounted on the first surface 110A of the flexible substrate 110, an insulating reflective layer 120 disposed on the first surface 110A of the flexible substrate 110, first and second connection terminals 270a and 270b for applying a driving voltage and connected to the plurality of LED chips 150, and a wavelength conversion portion 190 covering the plurality of LED chips 150 and surrounding the flexible substrate 110.

The flexible substrate 110 may include a circuit pattern 115 disposed on the first surface 110A. The plurality of LED chips 150 may be electrically connected to the circuit pattern 115. For example, the plurality of LED chips 150 may be connected to the circuit pattern 115 in a flip-chip bonding method. For example, first and second electrodes 159a and 159b of the plurality of LED chips 150 may be connected to the circuit pattern 115 by conductive bumps such as solder.

The insulating reflective layer 120 may be formed to cover a portion of the circuit pattern 115. The insulating reflective layer 120 employed in this embodiment may contribute to an improvement of luminous flux by preventing light absorption by the circuit pattern 115, such as copper. For example, the circuit pattern 115 may be made of a copper layer.

As illustrated in FIG. 2, the insulating reflective layer 120 may be formed to cover other regions, excluding pad regions 115a, connected to the first and second electrodes 159a and 159b of the LED chip 150. For example, the insulting reflective layer 120 may expose pad regions 115a and may cover all of the circuit pattern 115 other than the pad regions 115a. For example, the insulating reflective layer 120 may be formed along the circuit pattern 115 to have a shape similar to the circuit pattern except the pad regions 115a. The insulating reflective layer 120 may be used as a means for adjusting light distribution characteristics (a light flux ratio between forward emitted light and backward emitted light with respect to the flexible substrate 110). In this example, the direction from the flexible substrate 110 to the LED chip corresponds to the forward direction, and the backward direction is the direction opposite to this forward direction. In this embodiment, since the insulating reflective layer 120 is formed according to an arrangement of the circuit patterns 115, other regions of the first surface 110A of the flexible substrate may be exposed, e.g., by the insulating reflective layer 120. Therefore, a light flux ratio may be adjusted to increase the relative emission of the backward emitted light (with respect to the forward emitted light).

The insulating reflective layer 120 may be a white reflective layer. For example, the white reflective layer may be a resin layer containing a white-photo solder resist (W-PSR) or a white ceramic powder. The white ceramic powder may include at least one selected from $TiO_2$, $Al_2O_3$, $Nb_2O_5$, and ZnO. For example, the color reflective layer 120 may have a white color and reflect white light, e.g., emitted from the LED chips. The white-photo solder resist (W-PSR) may be a photosensitive solder resist made of an insulating material that covers the first surface of including the circuit pattern and protects the circuit pattern. The W-PSR may insulate and protect the circuit pattern from contacting and/or from being contaminated by other layers, materials (dust, moisture, etc.) or heat.

The flexible substrate 110 employed in this embodiment may have flexibility, and may be processed into various shapes in a lamp. For example, the flexible substrate 110 may include a material selected from the group consisting of polyimide (PI), polyamide imide (PAI), polyethylene terephthalate (PET), polyethylene naphthalene (PEN), and silicone.

In some embodiments, the flexible substrate 110 may use a flexible material having a light transmittance of 80% or more, such that light distribution through a back surface of the flexible substrate 110 may be greatly improved. For example, a backward light distribution through the flexible substrate 110 may be improved. For example, conventional aromatic polyimides may have a relatively low light transmittance (for example, 70% or less), e.g., because they are colored like yellowish polyimide. For example, when colorless polyimides having a relatively high light transmittance are used, such colorless polyimides may have a light transmittance of 80% or more, or 90% or more. For example, the colorless polyimides may be obtained by processing colored polyimides. The aromatic polyimides may have a relatively low light transmittance in the visible light band (e.g., less than 70% at 550 nm or less), e.g., since they have a color such as yellow. The colorless polyimide may have a relatively high light transmittance with respect to visible light band, e.g., an average light transmittance (e.g., through a range of visible light band) of 80% or more, e.g., about 90%. When such a colorless polyimide is used, light distribution through a back surface of the substrate may be greatly increased. For example, the colorless polyimide may be transparent and light emitted from the LED chips may be distributed in the backward direction through the colorless polyimide substrate.

The aromatic polyimides may have yellow light by transferring π-electrons of benzene, present in a main chain of an imide, to an intermolecular bonding to lower an energy level, and by absorbing a long wavelength region of the visible light. However, in the present embodiment, the colorless polyimide having a relatively high light transmittance may be provided, by introducing a functional structure including an element having a strong electronegativity to restrict a transfer of π-electrons, or by introducing a non-benzene cyclic structure to decrease a density of π-electrons.

As another example, the flexible substrate 110 may include a silicone resin composition mixed with a polyorganosiloxane, a silicone resin, a crosslinking agent, and a catalyst.

As illustrated in FIGS. 1 and 2, the plurality of LED chips 150 may be arranged in a single row, and may be connected in series by the circuit pattern 115. The first and second connection terminals 270a and 270b may be respectively disposed at both ends of the flexible substrate 110 to be connected to the circuit pattern 115. In alternative embodiments, the plurality of LED chips 150 may be arranged in a plurality of rows, and may be partially connected in parallel. For example, when arranged in a plurality of rows, the plurality of LED chips 150 may be connected in series in each row, and the plurality of rows may be connected to the first and second connection terminals 270a and 270b together, to be connected to each other in parallel. For example, each row of the plurality of rows may have two ends respectively connected to the first and second connection terminals 270a and 270b.

Figure 3:
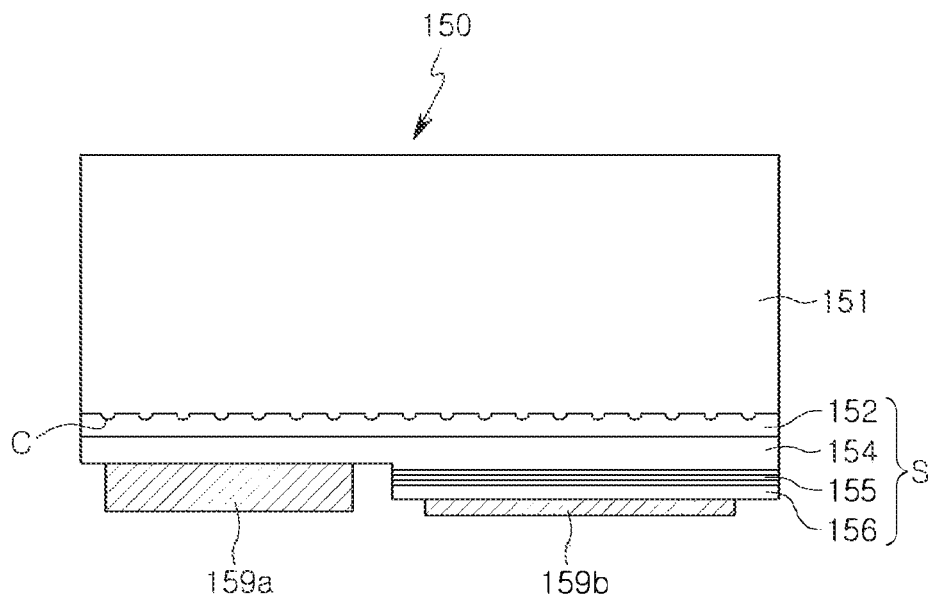
FIG. 3 is a cross-sectional view of an LED chip that may be employed in the LED module illustrated in FIG. 1.

The LED chip 150 employed in this embodiment may be an LED having a flip-chip structure, as described above. FIG. 3 is a cross-sectional view illustrating an embodiment of an LED chip that may be employed in the LED module illustrated in FIG. 1.

Referring to FIG. 3, an LED chip 150 may include a light-transmitting substrate 151, and a first conductive semiconductor layer 154, an active layer 155, a second conductive semiconductor layer 156 sequentially arranged on the substrate 151. A buffer layer 152 may be disposed between the substrate 151 and the first conductive semiconductor layer 154.

The substrate 151 may be an insulating substrate such as a sapphire substrate, but is not limited thereto. For example, the substrate 151 may be a conductive substrate or a semiconductor substrate. For example, the substrate 151 may be a SiC, Si, $MgAl_2O_4$, MgO, $LiAlO_2$, $LiGaO_2$, or GaN substrate. A concavo-convex portion C may be formed on an upper surface of the substrate 151. The concavo-convex portion C may improve quality of a single crystal to be grown, while improving light extraction efficiency.

The buffer layer 152 may be $In_xAl_yGa_{1-x-y}N$ ($0 \leq x \leq 1$, $0 \leq y \leq 1$). For example, the buffer layer 152 may be GaN, AlN, AlGaN, or InGaN. In certain embodiments, the buffer layer 152 may be used by combining a plurality of layers therein, or by gradually changing a composition thereof. For example, a ratio of one element to another element may gradually change along the thickness direction of the buffer layer 152.

The first conductive semiconductor layer 154 may be a nitride semiconductor that satisfies an n-type $In_xAl_yGa_{1-x-y}N$ ($0 \leq x < 1$, $0 \leq y < 1$, $0 \leq x+y < 1$), e.g., including an n-type impurity. The n-type impurity may be Si. For example, the first conductive semiconductor layer 154 may include an n-type GaN. The second conductivity type semiconductor layer 156 may be a nitride semiconductor layer that satisfies a p-type $In_xAl_yGa_{1-x-y}N$ ($0 \leq x < 1$, $0 \leq y < 1$, $0 \leq x+y < 1$), e.g., including a p-type impurity. The p-type impurity may be Mg. For example, the second conductive semiconductor layer 156 may have a single-layer structure, or may have a multi-layer structure having different compositions as in the present example. The active layer 155 may have a multiple quantum well (MQW) structure in which quantum well layers and quantum barrier layers are alternately stacked. For example, the quantum well layers and the quantum barrier layers may include $In_xAl_yGa_{1-x-y}N$ ($0 \leq x \leq 1$, $0 \leq y \leq 1$, $0 \leq x+y \leq 1$) having different compositions. In certain examples, the quantum well layers may include $In_xGa_{1-x}N$ ($0 < x \leq 1$), and the quantum barrier layers may include GaN or AlGaN. Thicknesses of the quantum well layers and the quantum barrier layers may be in the range of 1 nm to 50 nm, respectively. The active layer 155 is not limited to a multiple quantum well structure, and may be a single quantum well structure.

The first and second electrodes 159a and 159b may be disposed on a mesa-etched region of the first conductivity type semiconductor layer 154, and the second conductivity type semiconductor layer 156, respectively. The first electrode 159a may include a material such as Ag, Ni, Al, Cr, Rh, Pd, Ir, Ru, Mg, Zn, Pt, Au, or the like, but is not limited thereto, and may be adopted as a structure of a single layer or layers of two or more. In certain embodiments, the second electrode 159b may be a transparent electrode such as a transparent conductive oxide electrode or a transparent conductive nitride electrode, or may include a graphene. For example, the second electrode 159b may include a transparent conductive oxide, a transparent conductive nitride and/or graphene. The second electrode 159b may include at least one of Al, Au, Cr, Ni, Ti, and Sn.

Figure 4:
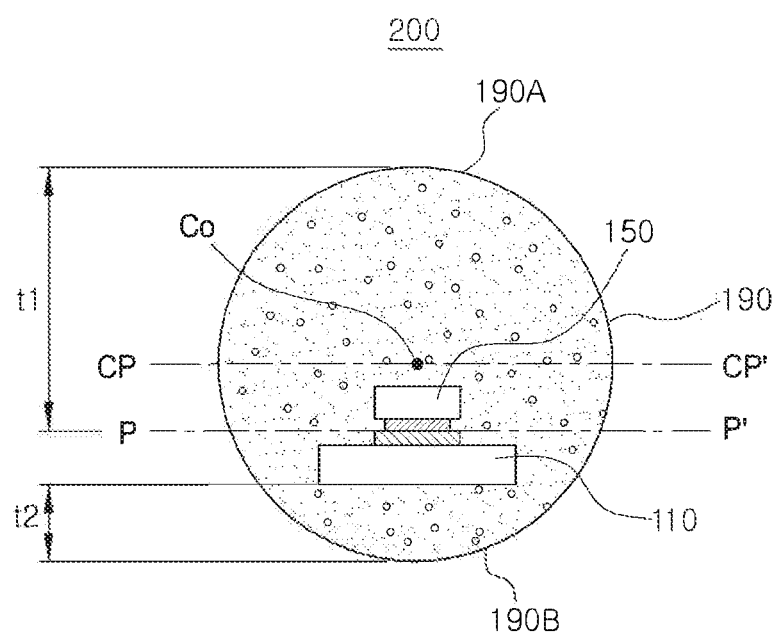
FIG. 4 is a cross-sectional view of the LED module illustrated in FIG. 1, taken along line I-I'.
Figure 5:
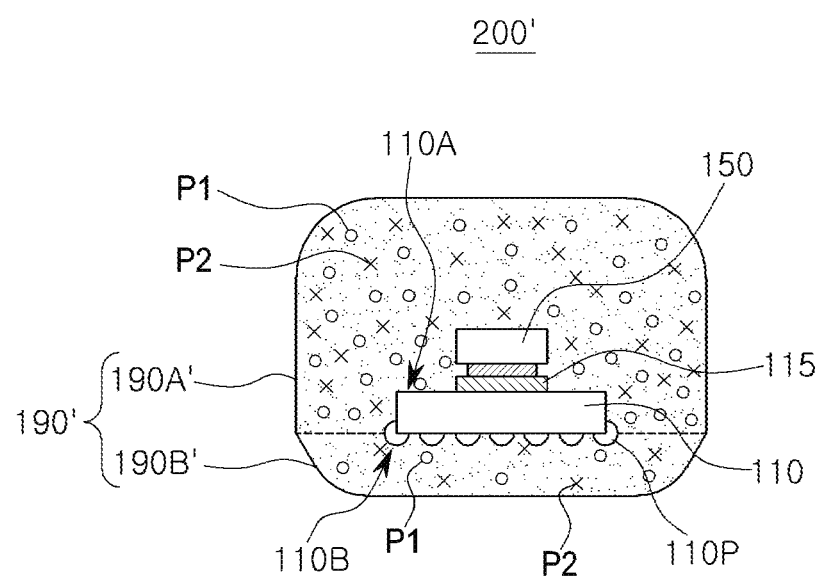
FIG. 5 is a cross-sectional view of an LED module according to an embodiment of the present inventive concept.

The wavelength conversion portion 190 may include a transparent resin 190S and a wavelength converting material P such as a phosphor or a quantum dot, and the transparent resin 190S may contain the wavelength converging material P in the transparent resin 190s. For example, the wavelength conversion portion 190 may be a layer including first and second wavelength conversion layers. The first wavelength conversion layer may cover the first surface 110A of the flexible substrate 110 and the LED chips 150 formed on the first surface 110A. The second wavelength conversion layer may cover the second surface 110B of the flexible substrate 110. For example, the transparent resin 190S and the wavelength converting material P may be mixed together to form the wavelength conversion layer 190. For example, the wavelength conversion layer 190 may surround the flexible substrate 110 in a cross-sectional view as shown in FIGS. 4 and 5. The wavelength converting material P may convert a portion of light generated from the plurality of LED chips 150 into light of the converted wavelength. For example, the wavelength converting material P may absorb the light generated form the plurality of LED chips 150 and emit a light (or a band of light) having different wavelengths from the ones emitted from the LED chips 150. The wavelength converting material P may be composed of at least one wavelength converting material such that finally emitted light is obtained as white light. For example, the wavelength converting material P may include at least one of a yellow phosphor, a green phosphor, and a red phosphor, when the wavelength converting material P may include two or more wavelength converting materials.

Referring to FIG. 1, the wavelength conversion portion 190 may be formed to surround the flexible substrate 110 while covering the plurality of LED chips 150. Therefore, light (L1 and L2) to be emitted from front and rear surfaces of the LED module 200 (e.g., emitted through the wavelength conversion layer 190) may all be converted into desired light through the wavelength conversion portion 190. For example, at least a portion of the light emitted from the LED chips 150 may be converted into light having different wavelength, and the light (L1 and L2) emitted through the front and rear surfaces of the LED module 200 may have a desired light spectrum of light.

The wavelength conversion portion 190 employed in this embodiment may be described in detail with reference to FIG. 4. FIG. 4 is a cross-sectional view of the LED module 200 illustrated in FIG. 1, taken along line I-I'.

Referring to FIG. 4, the wavelength conversion portion 190 may include a first wavelength conversion portion 190A disposed on the first surface 110A on which the plurality of LED chips 150 are disposed, and a second wavelength conversion portion 190B disposed on the second surface 110B of the flexible substrate 110.

In this embodiment, the wavelength conversion portion 190 may be formed such that a mounting surface P-P' (or the first surface) of the flexible substrate 110 is disposed in a position lower than a position of a plane CP-CP' passing a central portion $C_o$ of the wavelength conversion portion 190 and extending parallel to the mounting surface P-P'. In this structure, a surface area of the first wavelength conversion portion 190A formed on the front surface of the flexible substrate 110 may be larger than a surface area of the second wavelength conversion portion 190B formed on the rear surface of the flexible substrate 110. For example, the surface areas may be the outer surfaces of the first and second wavelength conversion portions 190A and 190B.

Such structure and arrangement may be used to adjust a quantity of light emitted forward and a quantity of light emitted backward. For example, a quantity of light may be a sum of light intensity emitted to a certain area of space/surface, e.g., forward emitted light or backward emitted light. A thickness t1 of the first wavelength conversion portion 190A may be greater than a thickness t2 of the second wavelength conversion portion 190B. Therefore, when the thickness t2 of the second wavelength conversion portion 190B is formed to be relatively thin, a quantity of light L1 emitting forward and deviation between quantities of light L1 and L2 may be relatively reduced, and color tone of light emitted forward and backward may be uniformly adjusted.

FIG. 5 is a cross-sectional view illustrating an LED module according to an embodiment of the present inventive concept.

Referring to FIG. 5, an LED module 200' according to this embodiment may have a substantially rectangular cross-section, and may have a structure similar to the LED module 200 illustrated in FIG. 4, except for the fact that a concavo-convex portion 110P is formed on a second surface 110B of a flexible substrate 110. The description of the components of this embodiment may be referred to the description of the same or similar components of the LED module 200 illustrated in FIGS. 1, 2 and 4, unless specified otherwise.

A wavelength conversion portion 190' according to this embodiment may include a first wavelength conversion portion 190A' disposed on a front surface of the flexible substrate 110, and a second wavelength conversion portion 190B' disposed on a rear surface of the flexible substrate 110, and the first wavelength conversion portion 190A' and the second wavelength conversion portion 190B' may be formed by separate processes, respectively. In certain embodiments, as shown in FIG. 5, the side areas of the flexible substrate 110 may also be covered with the same wavelength conversion material as the ones disposed on the front surface of the flexible substrate 110 so that the wavelength conversion portions formed on the side areas of the flexible substrate 110 are also indicated as 190A' in FIG. 5.

As described above, the first wavelength conversion portion 190A' and the second wavelength conversion portion 190B' may include different types of wavelength converting materials P1 and P2 and/or different content ratios of wavelength converting materials P1 and P2, and the first and second wavelength conversion portions 190A' and 190B' may be formed by using different processes or different steps of processes such as respective dispensing processes. Therefore, by reducing a scattering of light by the wavelength converting materials P1 and P2 in the second wavelength conversion portion 190B', a quantity of light L2 emitting through a rear surface of the wavelength conversion portion 190B' may be relatively increased, and a deviation between the quantities of light emitting through the front and rear surfaces of the of the wavelength conversion portion 190' may be relatively reduced. For example, a content ratio of the wavelength converting materials P1 and P2 of the first wavelength conversion portion 190A' to the resin 190S of the first wavelength conversion portion 190A' may be greater than a content ratio of the wavelength converting materials P1 and P2 of the second wavelength conversion portion 190B' to the resin 190S of the second wavelength conversion portion 190B'.

The wavelength conversion portion 190' may include first and second wavelength converting materials P1 and P2. When a plurality of LED chips 150 emit blue light, the first and second wavelength converting materials P1 and P2 may include a green phosphor and a red phosphor respectively, or at least one of a yellow phosphor, a green phosphor and a red phosphor.

Deviation between a quantity of light L1 emitting through a front surface of the wavelength conversion portion 190' and a quantity of light L2 emitting through a rear surface of the wavelength conversion portion 190' may be reduced by forming a thickness t1 of the first wavelength conversion portion 190A' to be greater than a thickness t2 of the second wavelength conversion portion 190B'. While FIG. 5 illustrates that 190A' includes wavelength conversion portion 190' formed on side portions of the flexible substrate 110, the thickness t1 and t2 may still refer to the thicknesses t1 and t2 in the same way as FIG. 4. In addition to shapes illustrated in this embodiment, a cross section of the wavelength conversion portion 190' may have various other shapes, e.g., ellipse, oval or trapezoid.

The concavo-convex portion 110P formed on the second surface 110B of the flexible substrate 110 may improve extraction efficiency of light emitting through the rear surface of the wavelength conversion layer 190. In this way, in addition to the addition of the concavo-convex portion 110P on the second surface 110B of the flexible substrate 110, various optical processing devices (e.g., low gloss surface design, applying a light scattering layer, etc.) may be used to variously design characteristics of the LED module 200', such as luminous flux of light emitting through a rear surface of the wavelength conversion layer 190, and light distribution.

Figure 6:
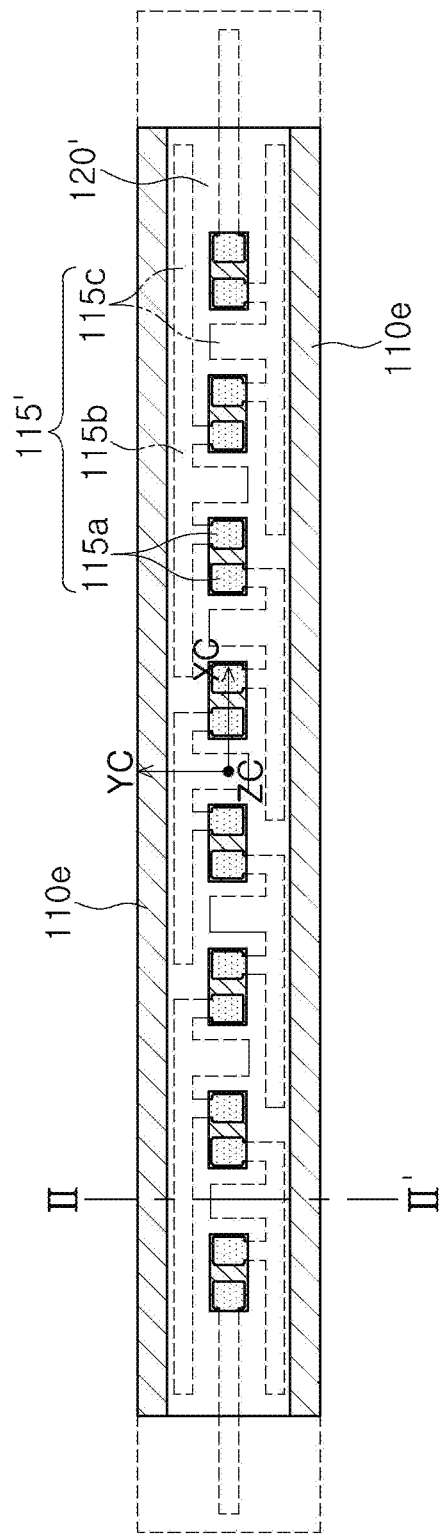
FIG. 6 is a plan view of a substrate employed in an LED module according to an embodiment of the present inventive concept.

FIG. 6 is a plan view of a substrate employed in an LED module according to an embodiment of the present inventive concept.

Referring to FIG. 6, it can be understood that a flexible substrate 110 employed in an LED module according to this embodiment may have the same structure as the flexible substrate of the LED module 200 of FIG. 2, except that a shape of a circuit pattern 115' and a region forming an insulating reflective layer 120' are different from those of FIG. 2. The description of the components of this embodiment may be referred to the description of the same or similar components of the flexible substrate of the LED module illustrated in FIG. 2, unless specified otherwise.

The circuit pattern 115' employed in this embodiment may further include a dummy pattern 115c, as well as a pad region 115a, and a connection pattern 115b connecting the pad regions 115a to each other. The dummy pattern 115c may have a shape protruding from the connection pattern 115b, irrespective of an electrical connection. The dummy pattern 115c may function to expand a heat dissipation area.

The dummy pattern 115c according to this embodiment may extend from the connection pattern 115b to a mounting region of an LED chip, or may have a form extended in a longitudinal direction at the outer periphery of the flexible substrate 110.

The insulating reflective layer 120' employed in this embodiment may be formed to cover another region of the circuit pattern 115', excluding the pad region 115a. For example, the insulating reflective layer 120' may cover the connection pattern 115b and the dummy pattern 115c, and does not cover the pad region 115a. As illustrated in FIG. 6, the insulating reflective layer 120' may be formed to expose both edges/corner regions 110e of an upper surface of the substrate 110.

The insulating reflective layer 120' may be provided as various types of white reflective layers. For example, the insulating reflective layer 120' may be cured after applying a coating layer on the flexible substrate 110, or may be provided using an adhesive sheet, e.g., on the flexible substrate 110 including the circuit pattern 115'.

Figure 7A:
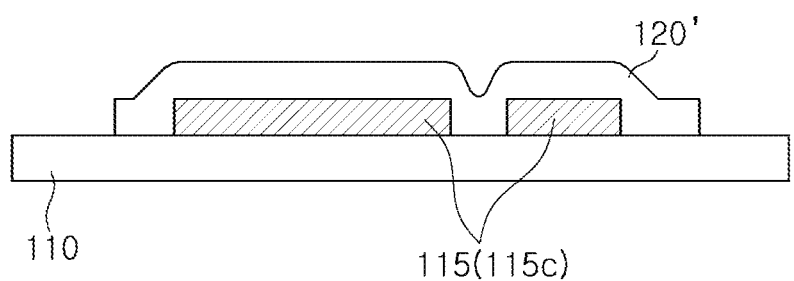
FIGS. 7A and 7B are cross-sectional views illustrating examples of an insulating reflective layer applied to the substrate illustrated in FIG. 6, respectively.
Figure 7B:
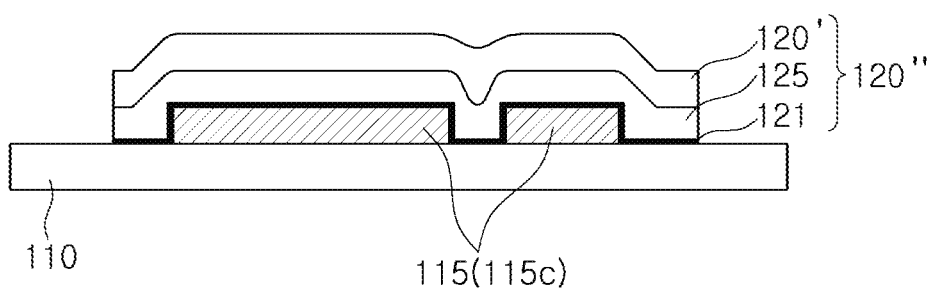

FIGS. 7A and 7B are cross-sectional views illustrating examples of an insulating reflective layer applied to the substrate (II-II' direction) illustrated in FIG. 6, respectively.

Referring to FIG. 7A, an insulating reflective layer 120' may be formed by applying a resin layer containing a white-photo solder resist (W-PSR) or a white ceramic powder to a desired region, and then curing the same.

In another example, as illustrated in FIG. 7B, an insulating reflective layer 120" may also be implemented by using the white-photo solder resist (W-PSR)-containing resin or the white ceramic powder-containing resin on a transparent sheet 125 such as polyimide to form an white reflective layer 120' in advance, and bonding them with an adhesive layer 121 provided on a lower surface of the transparent sheet 125.

To confirm an enhancement in luminous flux and a change in light distribution characteristics of an LED module according to this embodiment, various LED modules were manufactured with different conditions as shown in Table 1, and then the luminous flux and the light distribution characteristics were evaluated.

Comparative Examples A1, A2, and Example A were designed with a circuit pattern similar to that of FIG. 2, and materials of substrates were different from each other by using yellowish polyimide (PI) and colorless polyimide (CPI). Comparative Examples B1 and B2, and Examples B1, B2, and B3 were designed with a circuit pattern similar to that of FIG. 6, and materials of substrates were also different from each other by using yellowish polyimide (PI) and colorless polyimide (CPI).

In addition, an insulating reflective layer was formed in a region similar to that of FIG. 6 (excluding both corner regions) by applying a white-photo solder resist (W-PSR) in a thickness of 25 μm to only Examples A, B1, B2, and B3. In Example B3, the W-PSR layer was also applied to a lower surface of a flexible substrate in the same form.

TABLE 1

|  | Circuit pattern design | Flexible substrate material | Insulating reflective layer |
| --- | --- | --- | --- |
| Comparative Example A1 | FIG. 2 | PI 25 μm | No application |
| Comparative Example A2 | FIG. 2 | CPI 30 μm | No application |
| Example A | FIG. 2 | CPI 30 μm | W-PSR 25 μm/upper surface application |
| Comparative Example B1 | FIG. 6 | PI 25 μm | No application |
| Comparative Example B2 | FIG. 6 | CPI 30 μm | No application |
| Example B1 | FIG. 6 | PI 25 μm | W-PSR 25 μm/upper surface application |
| Example B2 | FIG. 6 | CPI 30 μm | W-PSR 25 μm/upper surface application |
| Example B3 | FIG. 6 | CPI 30 μm | W-PSR 25 μm/upper & lower surface application |

Figure 8:
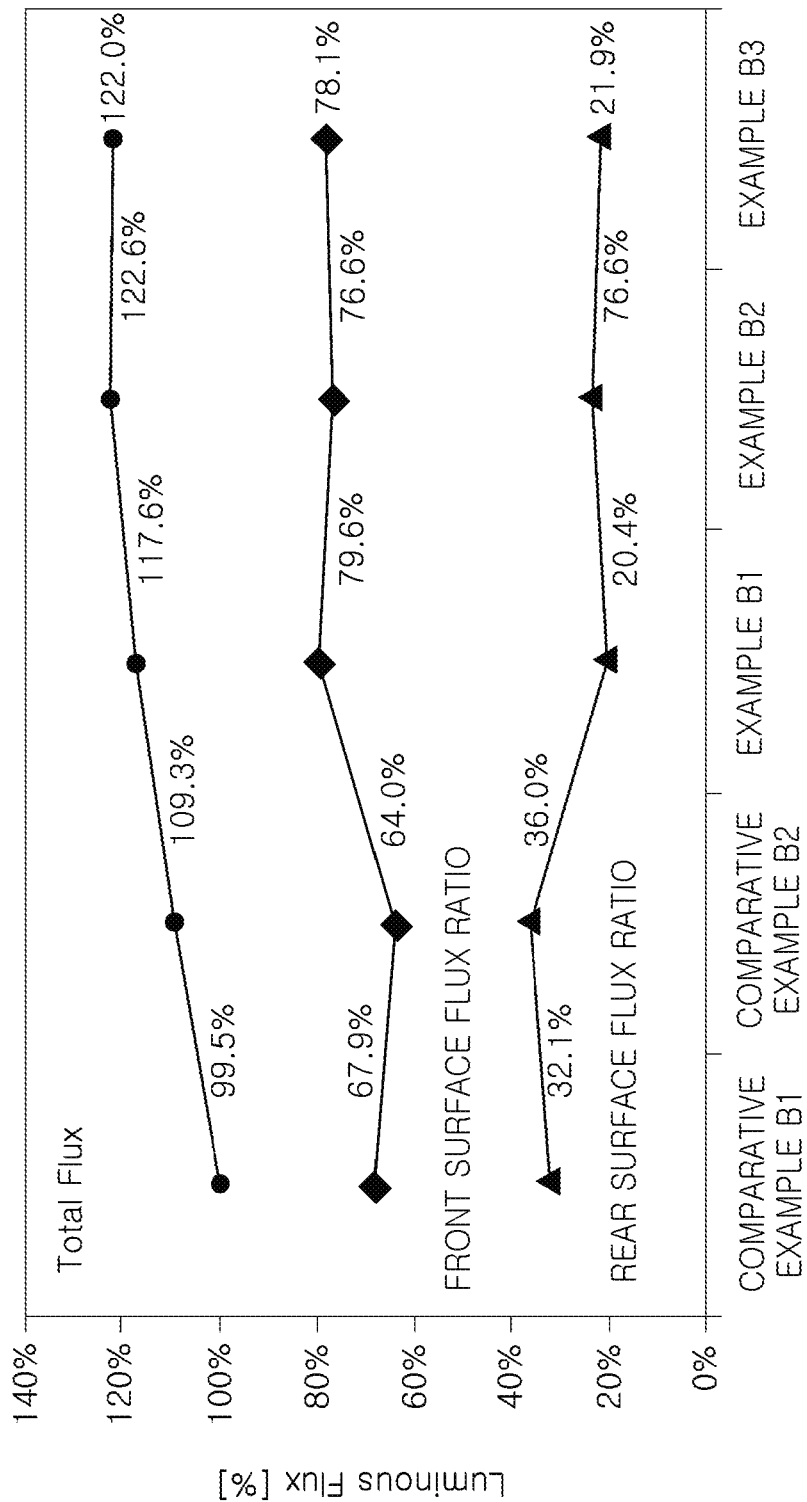
FIG. 8 is a graph illustrating an improvement in an intensity or a quantity of light of an LED module according to various embodiments.

The luminous flux and the light distribution characteristics of the various LED modules listed in Table 1 were measured, and the results are respectively described and illustrated in Table 2 and graphs of FIG. 8.

TABLE 2

|  | Total luminous flux | Front luminous flux ratio | Rear luminous flux ratio |
| --- | --- | --- | --- |
| Comparative Example A1 | 100% (Ref) | 64.6% | 35.4% |
| Comparative Example A2 | 112.6% | 60.4% | 39.6% |
| Example A | 116.9% | 65.6% | 34.4% |
| Comparative Example B1 | 99.5% | 67.9% | 32.1% |
| Comparative Example B2 | 109.3% | 64.0% | 36.0% |
| Example B1 | 117.6% | 79.6% | 20.4% |
| Example B2 | 122.6% | 76.6% | 23.4% |
| Example B3 | 122.0% | 78.1% | 21.9% |

Referring to Table 2 and FIG. 8, it can be confirmed that the respective overall light flux of the LED module according to these embodiments (Example A, Examples B1, B2, and B3) was increased as compared with Comparative Example A1 (Reference), and the light distribution characteristic may be variously changed by adjusting the material of the flexible substrate and the formation region of the insulating reflective layer.

Figures 9A, 9B:
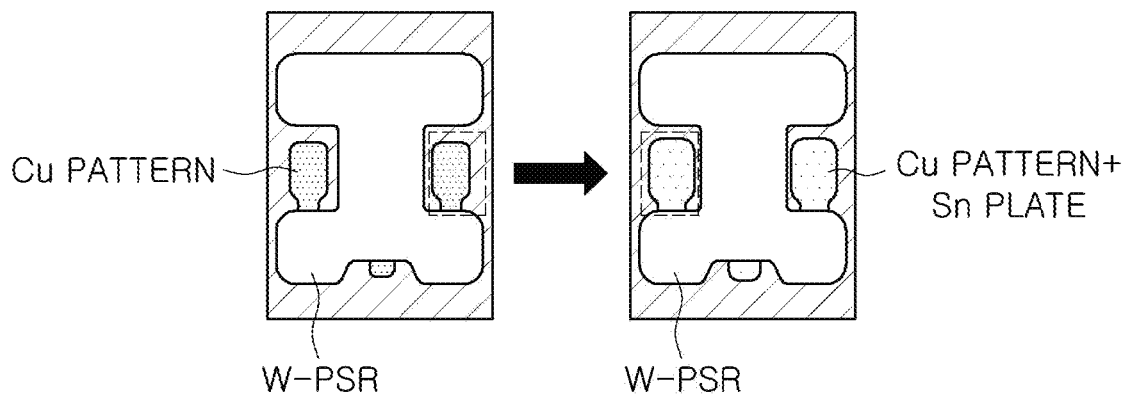
FIGS. 9A and 9B are plan views of a circuit pattern with and without Sn plating as embodiments of the present inventive concept.
Figure 10:
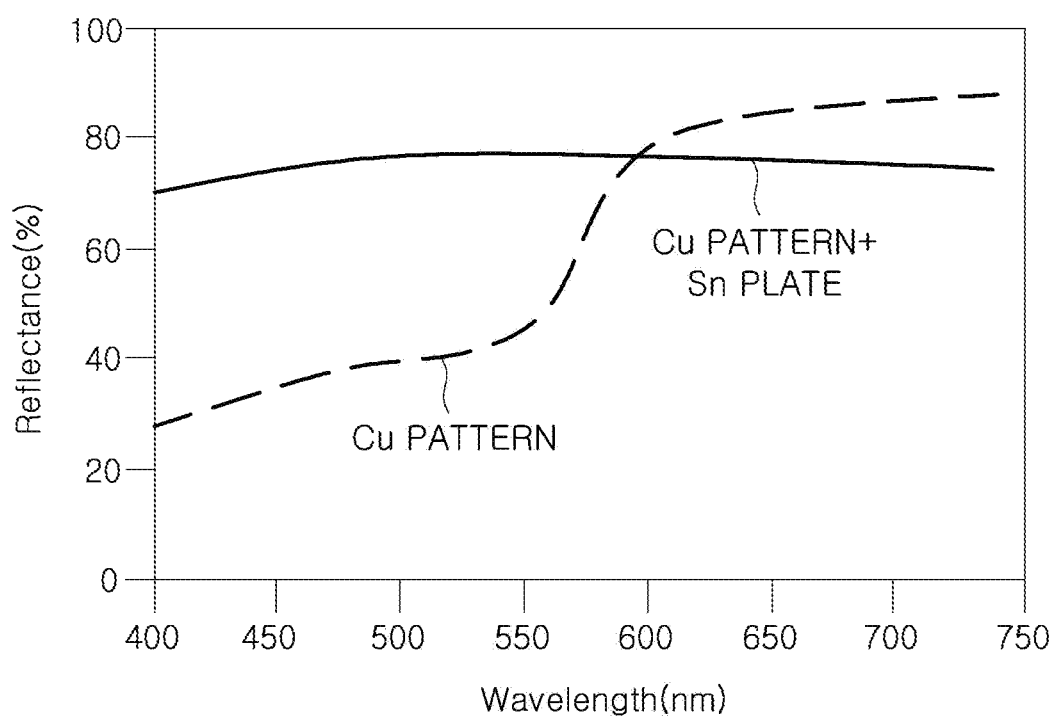
FIG. 10 is a graph illustrating spectral reflectance curves of the embodiment illustrated in FIGS. 9A and 9B.

FIGS. 9A and 9B are plan views of a circuit pattern with or without Sn plating as embodiments of the present inventive concept, and FIG. 10 is a graph illustrating spectral reflectance curves of the embodiment illustrated in FIGS. 9A and 9B.

In this embodiment, a reflectance of a circuit pattern itself may be improved. When a Cu pattern is mainly used as a circuit pattern (See FIG. 9A), a relatively low reflectance (for example, 50% or less) in the range of 400 to 550 nm may be resulted. However, the surface may be made to be a white color by applying tin (Sn) plating to a surface of the Cu pattern, and it may contribute to an improvement of the overall luminous flux (for example, +1.8%) by configuring to have a relatively high reflectance in the entire wavelength band. The improvement of the reflectance through the additional plating of the circuit pattern may be applied to the LED module alone. In certain embodiments, the LED module may be realized by being combined with the tin plating and an insulating reflective layer described in the previous embodiments.

An embodiment according to the present inventive concept is not limited to tin plating, and a reflectance of a circuit pattern may also be improved by plating a metal having a relatively high reflectance such as Ag.

FIG. 11 is a plan view of a substrate employed in an LED module according to an embodiment of the present inventive concept.

It can be understood that a flexible substrate 110 employed in an LED module according to this embodiment may be similar to the flexible substrate 110 of the LED module illustrated in FIG. 2, except that a shape of a circuit pattern 115 and a region forming an insulating reflective layer 220 are different from that of FIG. 2. The description of the components of this embodiment may be referred to the description of the same or similar components of the flexible substrate of the LED module illustrated in FIG. 2, unless specified otherwise.

The circuit pattern 115 employed in this embodiment may include a pad region 115a, and a connection pattern 115b connecting pad regions 115a. In addition, the circuit pattern 115 may further include a relatively small dummy pattern 115c protruding from the connection pattern 115b. A portion of the dummy pattern 115c may not be covered by the insulating reflective layer 220. As a result, heat dissipation performance using the dummy pattern 115c may be improved.

The insulating reflective layer 220 employed in this embodiment may have a plurality of patterns separated from each other in a longitudinal direction of the substrate 110. Since the LED module according to this embodiment is bent in the longitudinal direction of the substrate 110, the insulating reflective layer 220 may be easily cracked or broken to be peeled off the substrate 110. In order to prevent such damage, the insulating reflective layer 220 may be formed in a pattern separated into two mounting region units, as in this embodiment. For example, the insulating reflective layer 220 may have a plurality of separated patterns, and two LED chips may be mounted within each of the plurality of separated patterns of the reflective layer 220 as shown in FIG. 11.

Figure 12A:
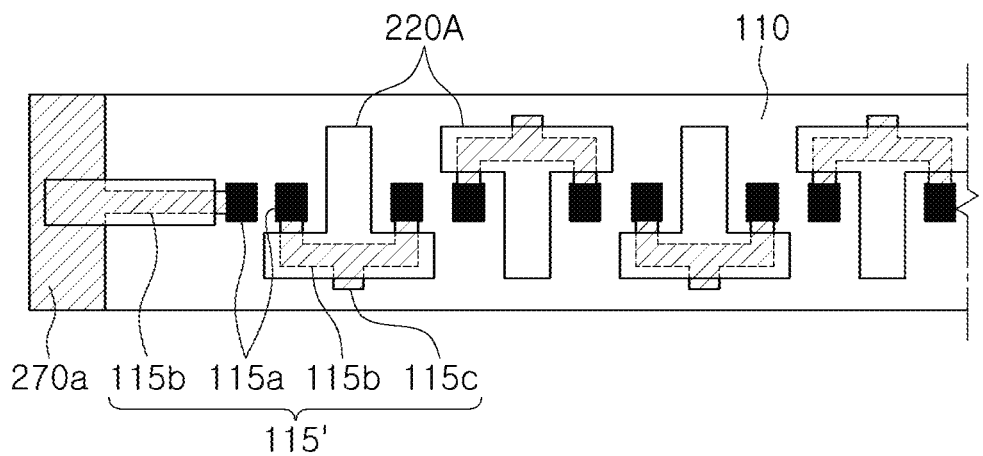
FIGS. 12A and 12B are plan views of a substrate employed in an LED module according to various embodiments of the present inventive concept.
Figure 12B:
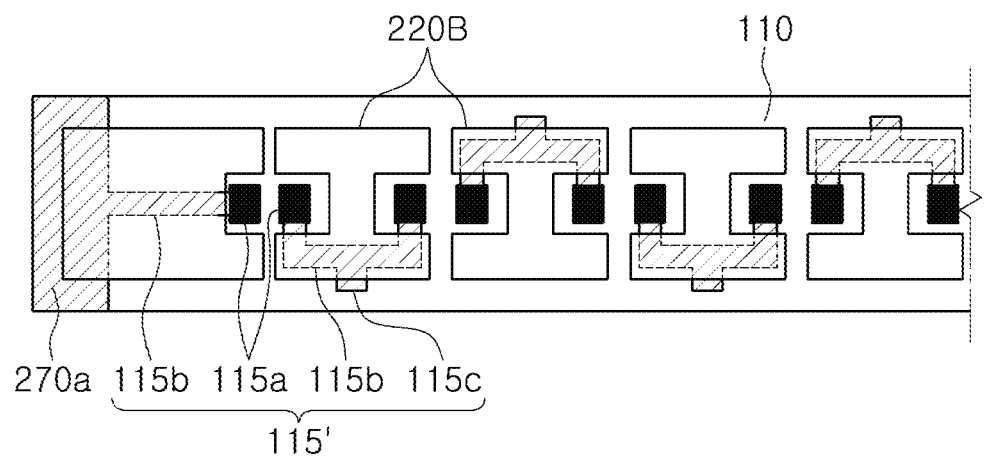

FIGS. 12A and 12B are plan views of a substrate employed in an LED module according to various embodiments of the present inventive concept.

It can be understood that a flexible substrate 110 employed in an LED module according to this embodiment may be similar to the flexible substrate of the LED module illustrated in FIG. 2, except that insulating reflective layers 220A and 220B of various patterns are used. The description of the components of this embodiment may be referred to the description of the same or similar components of the flexible substrate of the LED module illustrated in FIG. 2, unless specified otherwise.

The circuit pattern 115'' used in this embodiment also may include a pad region 115a, a connection pattern 115b connecting pad regions 115a, and a dummy pattern 115c protruding from the connection pattern 115b.

Referring to FIG. 12A, an insulating reflective layer 220A used in this embodiment may be separated in a longitudinal direction of the substrate 110, and may have a plurality of separated patterns having a T-shape. The plurality of separated patterns may have a T shape, and the T shape may be alternately arranged with an inverted T shape. According to this arrangement, the insulating reflective layer 220A may be formed to substantially surround mounting regions of the LED chip (a pair of the pad regions 115a), respectively. For example, the mounting regions/pad regions 115a may be exposed by the insulating reflective layers 220A and 220B.

Referring to FIG. 12B, an insulating reflective layer 220B used in this embodiment may be separated in a longitudinal direction of the substrate 110, and may have a plurality of separated patterns having an I-shape. The insulating reflective layer 220B may be formed to substantially surround mounting regions of the LED chip by arranging the I-shaped separation patterns in series, as illustrated in FIG. 12B.

As described above, the insulating reflective layers 220A and 220B used in this embodiment may prevent the insulating reflective layers 220A and 220B from being peeled off or broken from the substrate 110, even when being bent in a longitudinal direction of the substrate 110, by arranging the insulating reflective layers 220A and 220B in the longitudinal direction in various patterns, and reflection effect may be further improved by adopting a proper shape thereof, and by arranging the mounting region of the LED chip to surround the same.

Figure 13:
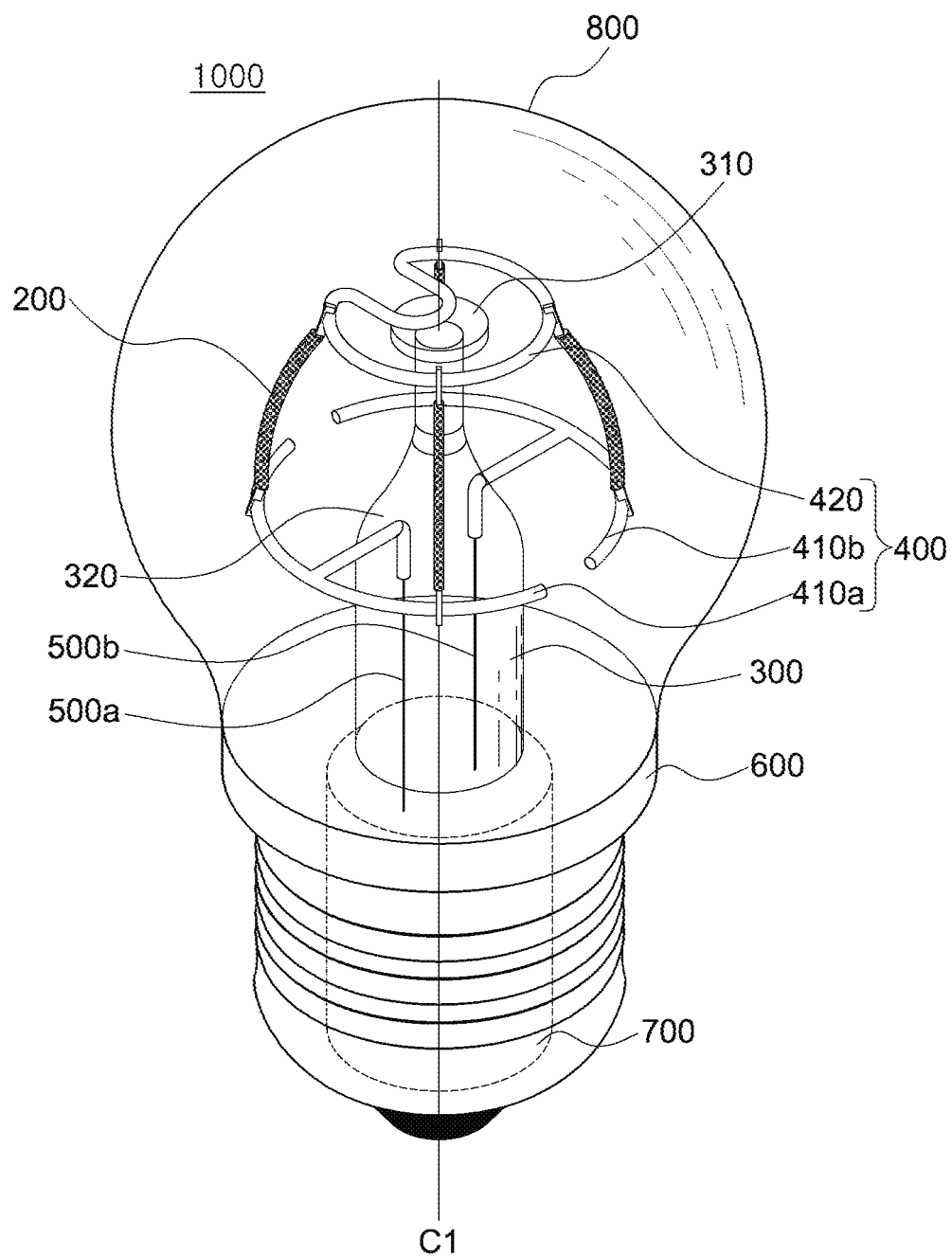
FIG. 13 is a perspective view illustrating an LED lamp according to an embodiment of the present inventive concept.
Figure 14:
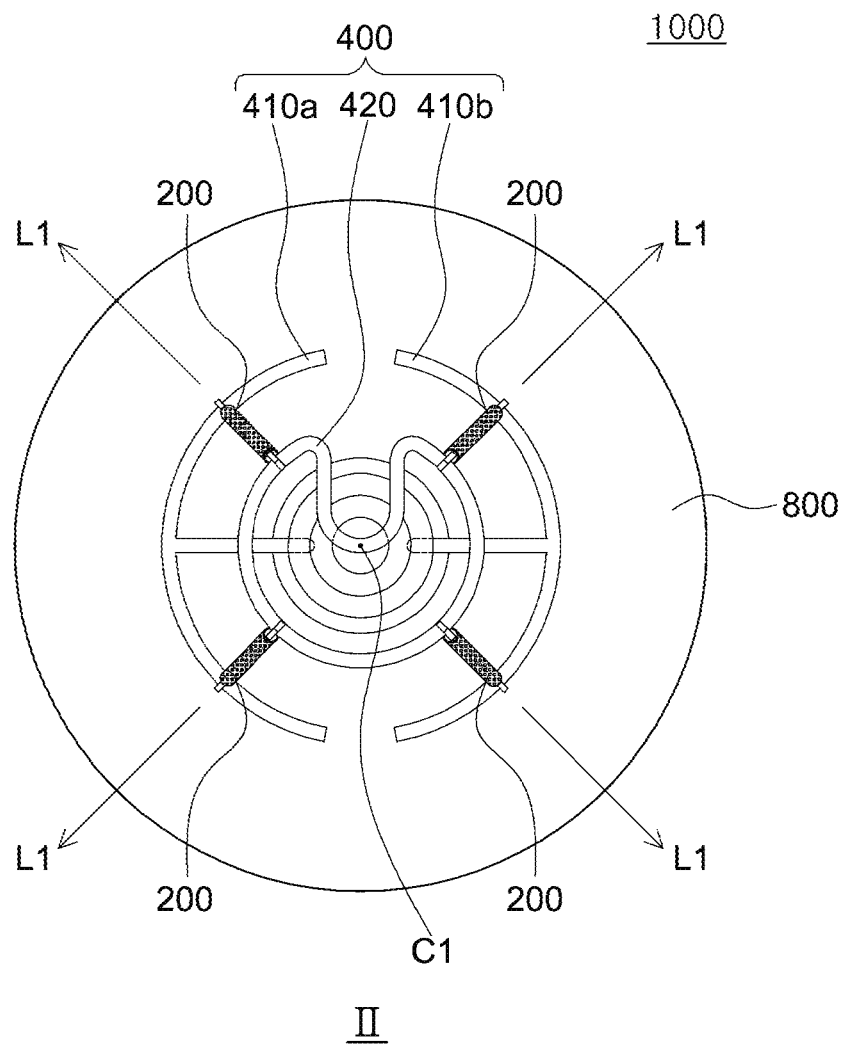
FIG. 14 is a plan view illustrating the LED lamp illustrated in FIG. 13.

FIG. 13 is a perspective view illustrating an LED lamp according to an embodiment of the present inventive concept, and FIG. 14 is a plan view illustrating the LED lamp illustrated in FIG. 13, which is viewed in a C1 direction.

Referring to FIGS. 13 and 14, an LED lamp 1000 according to this embodiment may include a base 600 having a socket structure, a lamp cover 800 mounted on the base 600 and having an internal space, a plurality of (e.g., four) LED modules 200 disposed in the internal space of the lamp cover 800.

When a connection frame 420 or a first and a second electrode frames 410a and 410b are fastened together, a main emitting face (i.e., an upper face) of the LED module 200 may be naturally directed toward the lamp cover 800, e.g., the upper surfaces 110A of the flexible substrate 110 may be directed toward the lamp cover 800, and an opposite surface (e.g., the second surfaces 110B) may be disposed to face the central axis C1.

The lamp cover 800 may be a transparent, milky, matte, or colored bulb cover made of glass, hard glass, quartz glass or a light transmissive resin. The lamp cover 800 may be one of various types. For example, this may be one of the existing bulb covers such as A-type, G-type, R-type, PAR-type, T-type, S-type, candle-type, P-type, PS-type, BR-type, ER-type, or BRL-type.

The base 600 may be combined with the lamp cover 800 to form an outer shape of the LED lamp 1000, and may be formed with a socket structure such as E40 type, E27 type, E26 type, E14 type, GU type, B22 type, BX type, BA type, EP type, EX type, GY type, GX type, GR type, GZ type, G type, or the like, to be replaced with the conventional lighting device.

Power applied to the LED lamp 1000 may be applied through the base 600. A power supply unit 700 may be disposed in the internal space of the socket 600, such that power applied through the base 600 may be AC-DC converted or changed in voltage, and supplied to the LED module 200.

One end of a column 300 may be fixed to the center axis C1 of the base 600, and a frame 400 for fixing the LED module 200 may be disposed on the column 300. For example, one end of the column 300 may be positioned at a center of the base 600 overlapping the center axis C1 of the base 600. The column 300 may cover an open region of the lamp cover 800, and may be welded through a high-temperature heat treatment to form a sealed internal space. Accordingly, the LED module 200 disposed in the internal space of the lamp cover 800 may be cut off from external moisture or the like. For example, the LED module 200 may be protected from a contamination and/or moisture by disposing the LED module 200 in a closed space between the column 300 and the lamp cover 800.

The frame 400 may fix the LED module 200, and be made of a metal material to supply electric power. The frame 400 may include a connection frame 420 for connecting the plurality of LED modules 200, and the first and second electrode frames 410a and 410b for supplying electric power. A seating portion 310 for fixing the connection frame 420 may be formed at the other end of the column 300. For example, one end of the column 300 may be disposed at the center of the base 600, and the connection frame 420 may be disposed on the other end of the column 300. The first and second electrode frames 410a and 410b may be fixed to a middle portion of the column 300 to support the plurality of LED modules 200 welded to the first and second electrode frames 410a and 410b. For example, portions of the first and second electrode frames 410a and 410b may penetrate into the column 300. The first and second electrode frames 410a and 410b may be connected to a first and a second electric wires 500a and 500b embedded in the column 300 such that power supplied from the power source unit 700 is applied to the first and second electrode frames 410a and 410b.

A plurality of LED modules 200 may be accommodated in the internal space of the lamp cover 800. The LED module 200 may be manufactured in a shape similar to a filament of a conventional incandescent bulb. For example each of the LED modules 200 may be formed to be a filament having a string shape to have less than 2 mm in its thickness and/or diameter in a direction perpendicular to its length direction. For example, a ratio of length to thickness of each LED module 200 may be 10 or greater. When power is applied, the LED module 200 may emit linear light like a filament, and may be also called an LED filament.

Referring to FIG. 14, an LED module 200 may be arranged radially such that a first surface 110A of each LED module may be adjacent to a lamp cover 800. It may be arranged in a rotationally symmetrical manner with respect to a central axis C1 of a base 600, when viewed from an upper portion of an LED lamp 1000, e.g. in a plan view as shown in FIG. 14. For example, in the internal space of the lamp cover 800, a main light emitting direction L1 of each LED module 200 may be arranged to be rotationally symmetrically arranged around a column 300 to face the lamp cover 800. For example, the main light emitting direction L1 may be a normal direction to the upper surface 110A (e.g., at a major—e.g., greater than 50%—planar portion thereof). In this arrangement, not only the light emitted through a front surface of the LED module 200 (e.g., the front surface of the light conversion layer 190) may be directly emitted through the lamp cover 800, but also the light emitted through a rear surface of the LED module 200 (e.g., the rear surface of the light conversion layer 190) may contribute to the total output of light.

The frame and electrical connection structure employable in this embodiment are not limited thereto, and may be implemented in various structures. For example, since the LED module 200 according to this embodiment includes a flexible substrate, the LED module 200 may be mounted in various shapes such as a bent shape to have a curved surface. For example, the LED module 200 according to this embodiment may be arranged to be oriented in various directions without being limited to a specific direction (the first surface faces the lamp cover) because a backward light distribution is enhanced.

Figure 15:
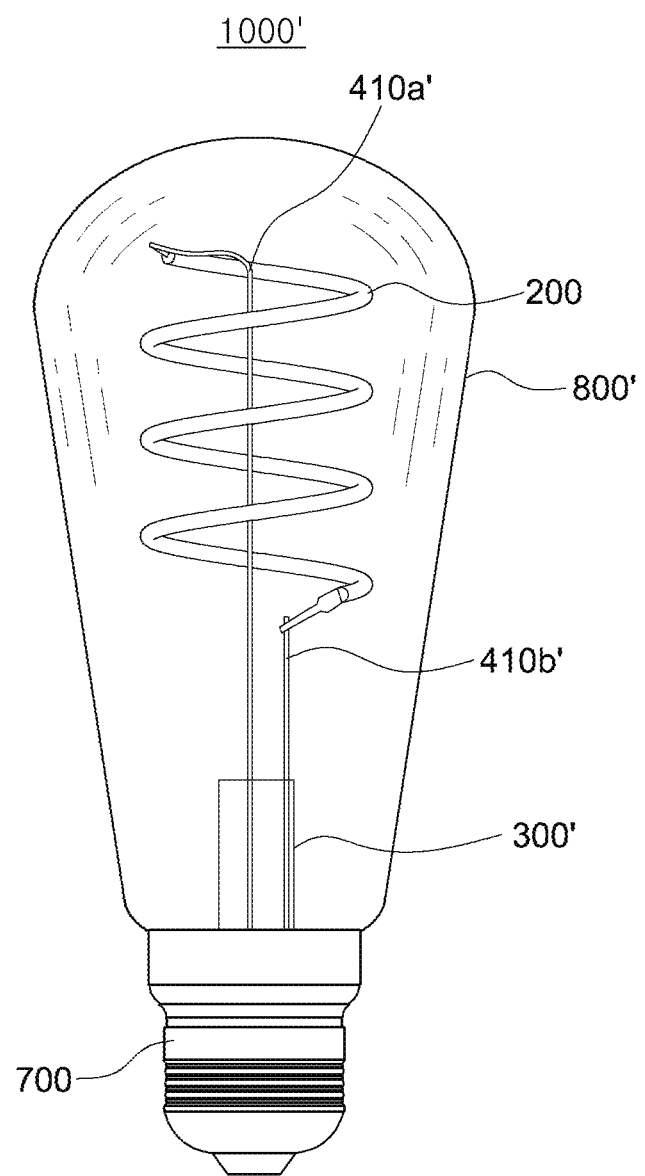
FIG. 15 is a front view illustrating an LED lamp according to an embodiment of the present inventive concept.

FIG. 15 is a front view illustrating an LED lamp according to an embodiment of the present inventive concept.

Referring to FIG. 15, an LED lamp 1000' according to this embodiment may be similar to an LED lamp 1000 illustrated in FIG. 13, except for that one LED module may be bent in a plurality of regions and that a structure of electrode frame may be different from the one in FIG. 13. The description of the components of this embodiment may be referred to the description of the same or similar components of the LED module 1000 illustrated in FIGS. 13 and 14, unless otherwise specified.

A lamp cover 800' may have a slightly elongated shape in an axial direction; unlike the lamp cover 800 employed in the previous embodiment. Both ends of an LED module 200 employed in this embodiment may be connected to first and second electrode frames 410a' and 410b' respectively, and may spirally surround the first electrode frame 410a' disposed along the axial direction as shown in FIG. 15. As such, since the LED module 200 includes a flexible substrate, it may be arranged in various bent shapes. In certain embodiments, a plurality of LED modules 200 may be employed.

Figure 16A:
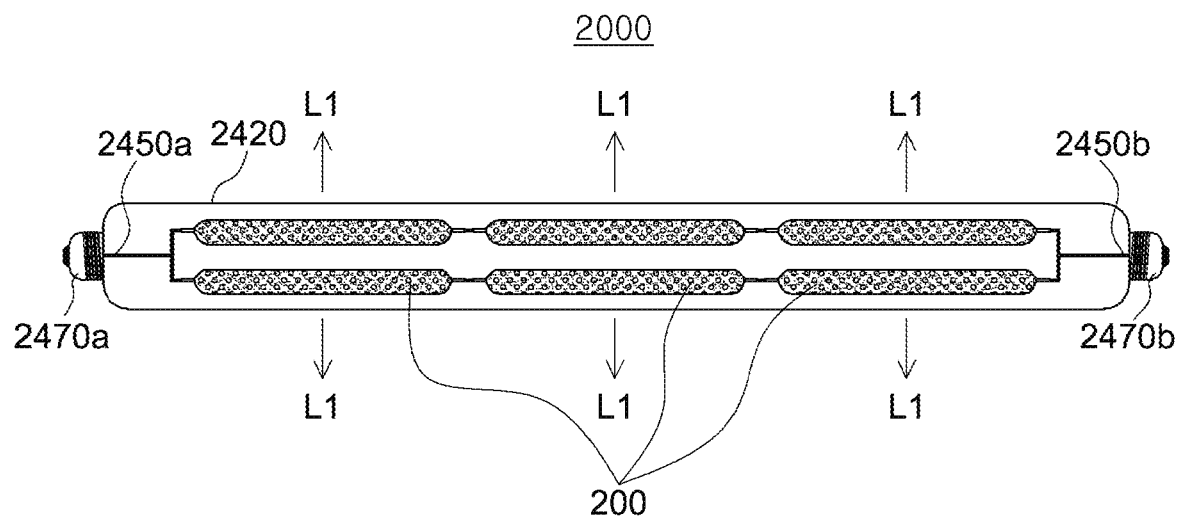
FIGS. 16A and 16B are perspective views illustrating LED lamps according to various embodiments of the present inventive concept, respectively.
Figure 16B:
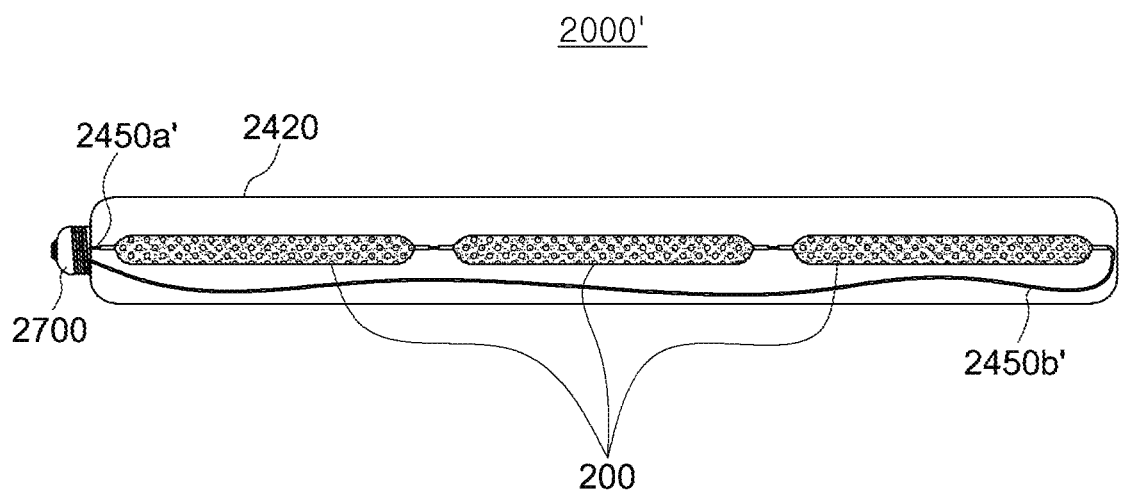

FIGS. 16A and 16B are perspective views illustrating LED lamps according to various embodiments of the present inventive concept, respectively.

Referring to FIG. 16A, an LED lamp 2000 according to this embodiment may include a lamp cover 2420 having a long bar shape in one direction, a plurality of LED modules 200 disposed in the lamp cover 2420, and a pair of sockets 2470a and 2470b disposed at both ends of the lamp cover 2420.

In this embodiment, the plurality of LED modules 200 may be illustrated by six LED modules. Two sets of three LED modules 200 may be arranged to be respectively connected in series, and these two series of rows may be arranged in parallel. The two rows of LED modules 200 connected in parallel may be arranged such that the front light L1 having a large light emission amount may be emitted through both opposite sides. The first and second wires 2450a and 2450b connected to both ends of the six LED modules 200 may be connected to a pair of sockets 2470a and 2470b, respectively.

Referring to FIG. 16B, an LED lamp 2000' according to this embodiment may include a lamp cover 2420, but include one socket 2700 which is similar to the one of the previous embodiment. The LED lamp 2000' according to this embodiment may include three LED modules 200 connected in series.

The socket 2700 employed in this embodiment may be different from the ones of the lamp according to the previous embodiment, and may include connection terminals having two different polarities, and may be connected to first and second wires 2450a' and 2450b', respectively as shown in FIG. 16B.

The present inventive concept is not limited to the above-described embodiments and the accompanying drawings, but is intended to be limited only by the appended claims. Accordingly, it is intended that the present inventive concept cover the modifications and variations of this invention provided that they come within the scope of the appended claims and their equivalents.

According to the embodiments described above, the luminous flux may be improved by providing the insulating reflective layer on the upper surface of the flexible substrate to cover a portion of the circuit pattern. For example, the light distribution characteristic (deviation in a quantity of light emitting forward and emitting backward) may be adjusted by adjusting the formation area of the insulating reflective layer.

In some embodiments, peeling of the insulating reflective layer may be prevented even when the LED lamp is flexibly mounted utilizing the characteristics of the flexible substrate, by forming the insulating reflective layer in a plurality of patterns separated from each other in a longitudinal direction. The various advantages and effects of the present inventive concept are not limited to the above description.

While example embodiments have been illustrated and described above, it will be apparent to those skilled in the art that modifications and variations could be made without departing from the scope of the present inventive concept as defined by the appended claims.

What is claimed is:

1. A light emitting diode (LED) module comprising:
a flexible substrate having a first surface on which a circuit pattern is disposed, and a second surface opposite to the first surface;
a plurality of light emitting diode (LED) chips mounted on the first surface of the flexible substrate, and electrically connected to the circuit pattern;
an insulating reflective layer disposed on the first surface of the flexible substrate, and covering a portion of the circuit pattern;
first and second connection terminals disposed at both ends of the flexible substrate, and connected to the circuit pattern; and
a wavelength conversion layer covering the plurality of LED chips and surrounding the flexible substrate in a cross-sectional view,
wherein the circuit pattern comprises a pad region connected to one of the plurality of LED chips, a connection pattern connected to the pad region, and a dummy pattern protruding from the connection pattern.

2. The LED module of claim 1, wherein the insulating reflective layer is disposed in a region of an upper surface of the flexible substrate, excluding regions adjacent to both edges of the upper surface of the flexible substrate.

3. The LED module of claim 1, wherein the insulating reflective layer is disposed to surround a periphery of each of the plurality of LED chips.

4. The LED module of claim 1, wherein the insulating reflective layer comprises a plurality of discrete patterns spaced apart from each other in a longitudinal direction of the flexible substrate, and
wherein the wavelength conversion layer contacts an upper surface and a bottom surface of the flexible substrate.

5. The LED module of claim 4, wherein each of the plurality of discrete patterns has a T-shape or an I-shape.

6. The LED module of claim 1, wherein the insulating reflective layer covers the circuit pattern including at least a portion of the dummy pattern and excluding the pad region.

7. The LED module of claim 1, wherein the circuit pattern comprises a copper layer, and a tin (Sn) layer formed on the copper layer.

8. The LED module of claim 1, wherein the insulating reflective layer comprises a white-photo solder resist.

9. The LED module of claim 1, wherein the insulating reflective layer comprises a resin containing a white ceramic powder.

10. The LED module of claim 9, wherein the white ceramic powder comprises at least one selected from $TiO_2$, $Al_2O_3$, $Nb_2O_5$, and ZnO.

11. A light emitting diode (LED) module comprising:
a flexible substrate having first and second surfaces opposite to each other, the flexible substrate having an elongated shape;
a circuit pattern disposed on the first surface of the flexible substrate, and having a pad region, a connection pattern connected to the pad region, and a dummy pattern protruding from the connection pattern;
a plurality of LED chips disposed on the first surface of the flexible substrate, each of the plurality of LED chips electrically connected to the pad region of the circuit pattern;
an insulating reflective layer mounted on the first surface of the flexible substrate, and covering a portion of the circuit pattern;
first and second connection terminals disposed at both ends of the flexible substrate, and connected to the circuit pattern; and
a wavelength conversion layer covering the plurality of LED chips and surrounding the flexible substrate in a cross-sectional view.

12. The LED module according to claim 11, wherein the insulating reflective layer covers a region of the circuit pattern including at least a portion of the dummy pattern, and excluding the pad region.

13. The LED module according to claim 12, wherein the insulating reflective layer comprises a plurality of discrete patterns spaced apart from each other in a longitudinal direction of the flexible substrate.

14. The LED module according to claim 13, wherein each of the plurality of discrete patterns have a T-shape or an I-shape.

15. The LED module according to claim 11, wherein the insulating reflective layer is disposed to surround a periphery of each of the plurality of LED chips in a region of an upper surface of the flexible substrate, excluding regions adjacent to both edges of the upper surface of the flexible substrate.

16. The LED module according to claim 11, wherein the insulating reflective layer comprises a sheet including a white photo-solder resist or white ceramic powder, and an adhesive layer disposed on a lower surface of the sheet.

17. The LED module according to claim 11, wherein the wavelength conversion layer has a first wavelength conversion layer disposed on the first surface of the flexible substrate, and a second wavelength conversion layer disposed on the second surface of the flexible substrate.

18. The LED module according to claim 17, wherein the wavelength conversion layer comprises a transparent resin and at least one wavelength conversion material,
wherein the at least one wavelength conversion material is mixed with the transparent resin, and
wherein a content ratio of a wavelength conversion material to the transparent resin in the first wavelength conversion layer is greater than a content ratio of a wavelength conversion material to the transparent resin in the second wavelength conversion layer.

19. A light emitting diode (LED) module comprising:

a flexible substrate having first and second surfaces opposite to each other, the flexible substrate having an elongated shape;

a circuit pattern disposed on the first surface of the flexible substrate;

a plurality of LED chips disposed on the first surface of the flexible substrate, and the plurality of LED chips electrically connected to the circuit pattern;

an insulating reflective layer comprising a plurality of discrete patterns arranged on the first surface of the flexible substrate to be spaced apart from each other in a longitudinal direction of the flexible substrate, the insulating reflective layer covering a portion of the circuit pattern;

first and second connection terminals respectively disposed at both ends of the flexible substrate, and the first and second connection terminals electrically connected to the circuit pattern; and a wavelength conversion layer covering the plurality of LED chips and surrounding the flexible substrate in a cross-sectional view.

* * * * *